United States Patent [19]

Jacobs

[11] Patent Number: 5,022,043
[45] Date of Patent: Jun. 4, 1991

[54] HIGH POWER DIODE-PUMPED SOLID STATE LASER WITH UNSTABLE RESONATOR

[75] Inventor: Ralph R. Jacobs, Freemont, Calif.

[73] Assignee: Spectra-Physics, Mountain View, Calif.

[21] Appl. No.: 455,525

[22] Filed: Dec. 20, 1989

[51] Int. Cl.⁵ .............................................. H01S 3/08
[52] U.S. Cl. ...................................... 372/95; 372/71; 372/75; 350/96.15; 350/96.25
[58] Field of Search ....................... 372/40, 41, 71, 75, 372/72, 95, 69, 70, 21, 22, 92; 350/96.1, 96.15, 96.18, 96.25

[56] References Cited

U.S. PATENT DOCUMENTS

| | | | |
|---|---|---|---|
| 4,688,884 | 8/1987 | Scifres et al. | 350/96.15 |
| 4,713,822 | 12/1987 | Lee | 372/69 |
| 4,763,975 | 8/1988 | Scifres et al. | 350/96.15 |
| 4,890,289 | 12/1989 | Basu et al. | 372/33 |
| 4,901,330 | 2/1990 | Wolfram et al. | 372/75 |

Primary Examiner—Frank Gonzalez
Assistant Examiner—Galen J. Hansen
Attorney, Agent, or Firm—Fliesler, Dubb, Meyer & Lovejoy

[57] ABSTRACT

A large number of semiconductor laser sources coupled with tapered fibers provide a high energy density output for the purpose of longitudinal pumping of a solid state gain medium in an unstable resonator. Each semiconductor laser source generates a beam of radiation at the pump wavelength having characteristic lateral and transverse widths. A plurality of light transmitting fibers, each fiber having an input end and an output end, is coupled with the semiconductor laser sources for delivering the light from a remote location to pump the gain medium. The input end of each fiber has a cross-section substantially matching the transverse and lateral widths of the beams generated by the corresponding semiconductor laser source, and is coupled to receive the beam of radiation generated by a corresponding semiconductor laser source. The output ends of the light transmitting fibers are bundled to deliver the beams coupled into the fibers as a composite light source having a high energy density. Hundreds of watts of pump energy can be delivered to an unstable resonator design with a solid state gain medium from a remotely mounted and cooled array of semiconductor lasers.

18 Claims, 3 Drawing Sheets

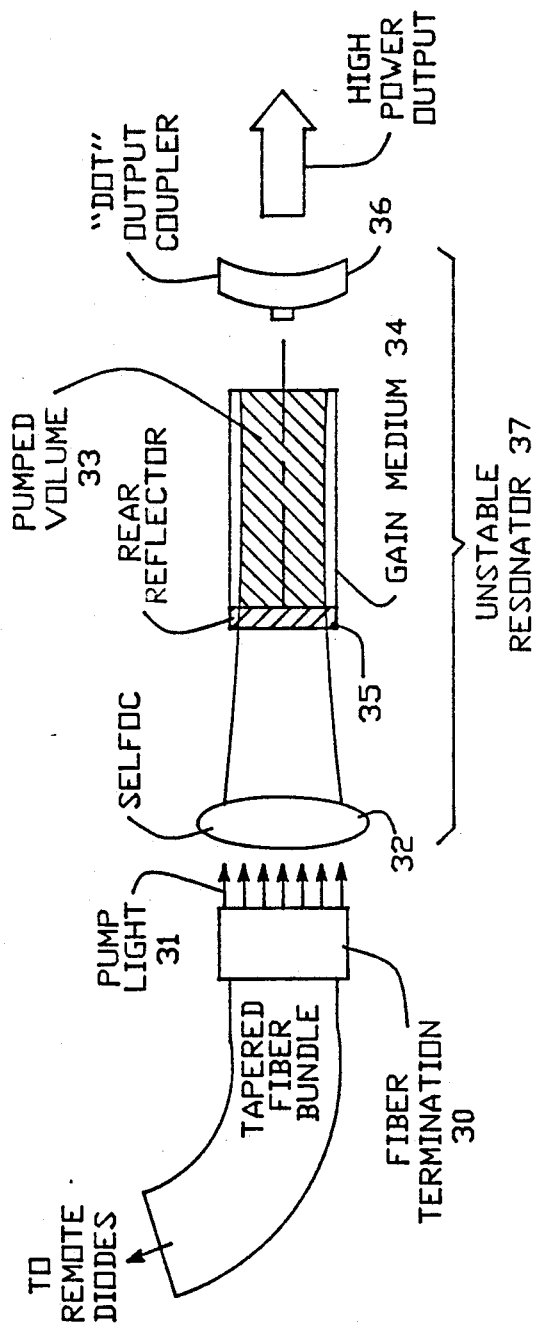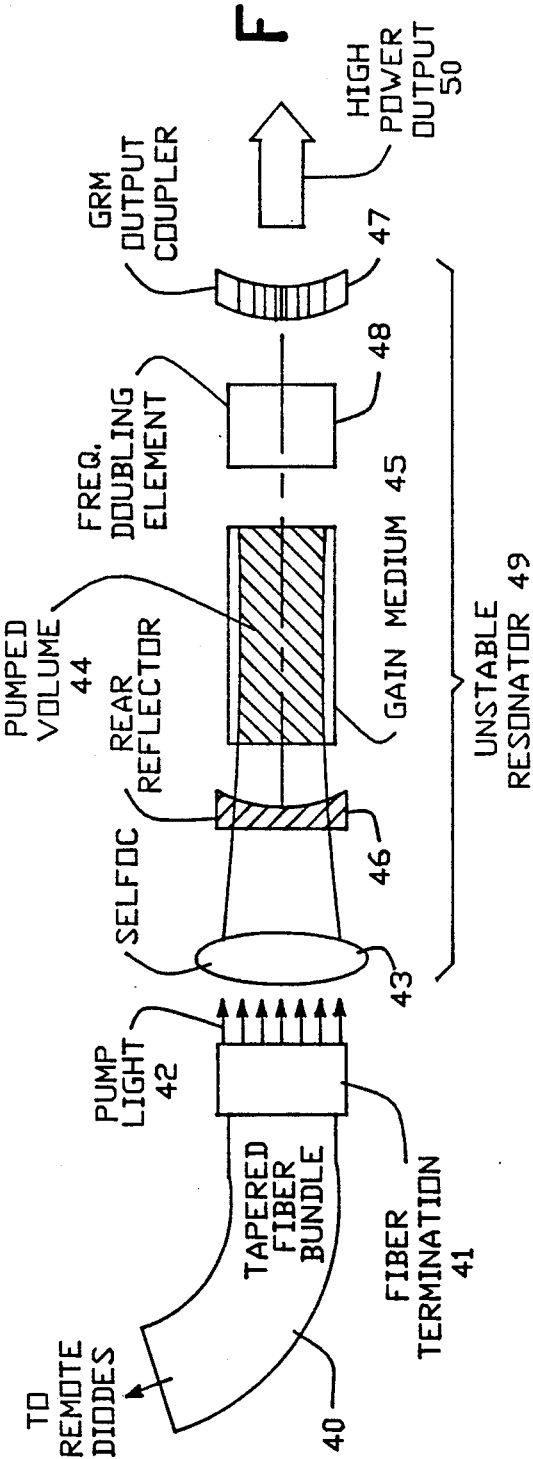

HIGH POWER DIODE-PUMPED SOLID STATE LASER WITH UNSTABLE RESONATOR

FIELD OF THE INVENTION

The present invention relates to high powered solid state lasers, and more particularly to ·diode-pumped solid state lasers in a unstable resonator system.

DESCRIPTION OF RELATED ART

Unstable resonators have been implemented for use in generating high powered laser beams. The unstable resonator is efficient for generating high powered beams because it is designed to support a cavity mode with a large cross section that sweeps a large volume of the gain medium for efficient transfer of energy out of the gain medium. For solid state systems, lasers using unstable resonators have typically been pumped by flash lamps or other high power energy sources. However, these excitation sources typically generate large amounts of waste heat deposited in the gain medium which limits the effective output power of the laser system and requires large package sizes.

Laser diodes have been used for pumping gain media in unstable resonators, as disclosed in my prior pending U.S. patent application NEAR RESONANT ND$^{3+}$ SOLID STATE LASER SYSTEM, Ser. No.: 07/418,287, Filed 10/06/89, Inventor: Ralph Jacobs. However, the pump power of such systems has been limited by the geometry of the laser diodes. In particular, laser diodes generate output beams with relatively wide but thin elongated cross-sections. An array of laser diodes, or a plurality of arrays, is necessary to supply any substantial amounts of power. To position an array of laser diodes in close proximity to a gain medium is cumbersome.

To solve this problem, laser systems have been developed in which resonators are fiber optically coupled to an array of laser diodes. Such systems are typified by the Spectra-Physics model 7200 Laser Diode module coupled with the model 7950 Q switched laser head. This system uses a low power folded cavity stable resonator laser, with a fiber optic coupling mechanism using circular optical fibers. The model 7200 provides for coupling a pump beam from the laser diodes of up to 500 milliwatts. High power applications require 10's to 100's of watts of pump energy with a high density.

Another problem with arrays of laser diodes, is cooling. To provide for cooling a large output power laser diode source, a bulky mechanism is required. Therefore this limits the ability to place laser diodes in close proximity to gain medium.

Accordingly, it is desirable to have an apparatus for efficiently coupling a high energy density beam generated by laser diodes for pumping a solid state laser medium.

SUMMARY OF THE INVENTION

The present invention overcomes these problems by using a large number of semiconductor laser diodes or other extended light sources, coupled with tapered fibers which provide a high energy density output for the purpose of longitudinal pumping of a solid state gain medium in an unstable resonator.

According to one aspect, the present invention is a laser system comprising a first mirror transmitting radiation at a pump wavelength and reflecting radiation at a cavity wavelength, and a second mirror partially reflecting radiation at the cavity wavelength, aligned with the first mirror to form an unstable optical cavity. The unstable optical cavity supports a cavity mode and partially transmits radiation in the cavity mode to supply the laser output.

A solid state gain medium is mounted within the unstable optical cavity and provides laser gain for the cavity mode. A plurality of semiconductor laser sources, or other extended light sources, generates pump radiation. Each semiconductor laser source in the plurality generates a beam of radiation at the pump wavelength having characteristic lateral and transverse widths.

A plurality of light transmitting fibers, each fiber having an input end and an output end is coupled with the plurality of semiconductor laser sources for delivering the light from a remote location to pump the gain medium. The input end of each fiber has a cross section substantially matching the transverse and lateral widths of the beam generated by the corresponding semiconductor laser source, and is coupled to receive the beam of radiation generated by the corresponding semiconductor laser source. The output end of the light transmitting fibers are bundled to deliver the beams coupled into the fibers as a composite light source having a high energy density. Means is mounted adjacent to first mirror and is connected to the plurality of light transmitting fibers near the output ends, for guiding the composite light source through the first mirror into the gain medium to deliver the pump energy.

According to another aspect of the invention, each semiconductor laser source in the plurality generates a beam having a lateral width of more than 50 microns and a transverse width of less than 10 microns. The input end of each of the light transmitting fibers has an oblong cross-section defining characteristic major and minor core diameters. The major core diameter is at least as large as the lateral width of the beam and the minor core diameter is less than the lateral width. The output ends of the light transmitting fibers are circular, or have another cross-section which provides for easy stacking of the fibers into a bundle to deliver a high energy density output.

Using the present invention, hundreds of watts of pump energy can be delivered to an unstable resonator design with a solid state gain medium from a remotely mounted and cooled plurality of semiconductor laser sources. This eliminates the limitations of the prior art systems that were caused by the large amounts of heat generated by the pump energy source, and the problems of delivering a high energy density beam for efficient pumping of the gain medium.

Other aspects and advantages of the present invention can be seen upon review of the figures, the detailed description and the claims which follow.

BRIEF DESCRIPTION OF THE FIGURES

FIG. 3 is a schematic diagram of an alternative embodiment of a laser system according to the present invention.

FIG. 4 is a schematic diagram of yet another alternative embodiment of a laser system according to the present invention.

DETAILED DESCRIPTION

A detailed description of preferred embodiments of the present invention is provided with reference to FIGS. 1 through 4.

Figure 1:
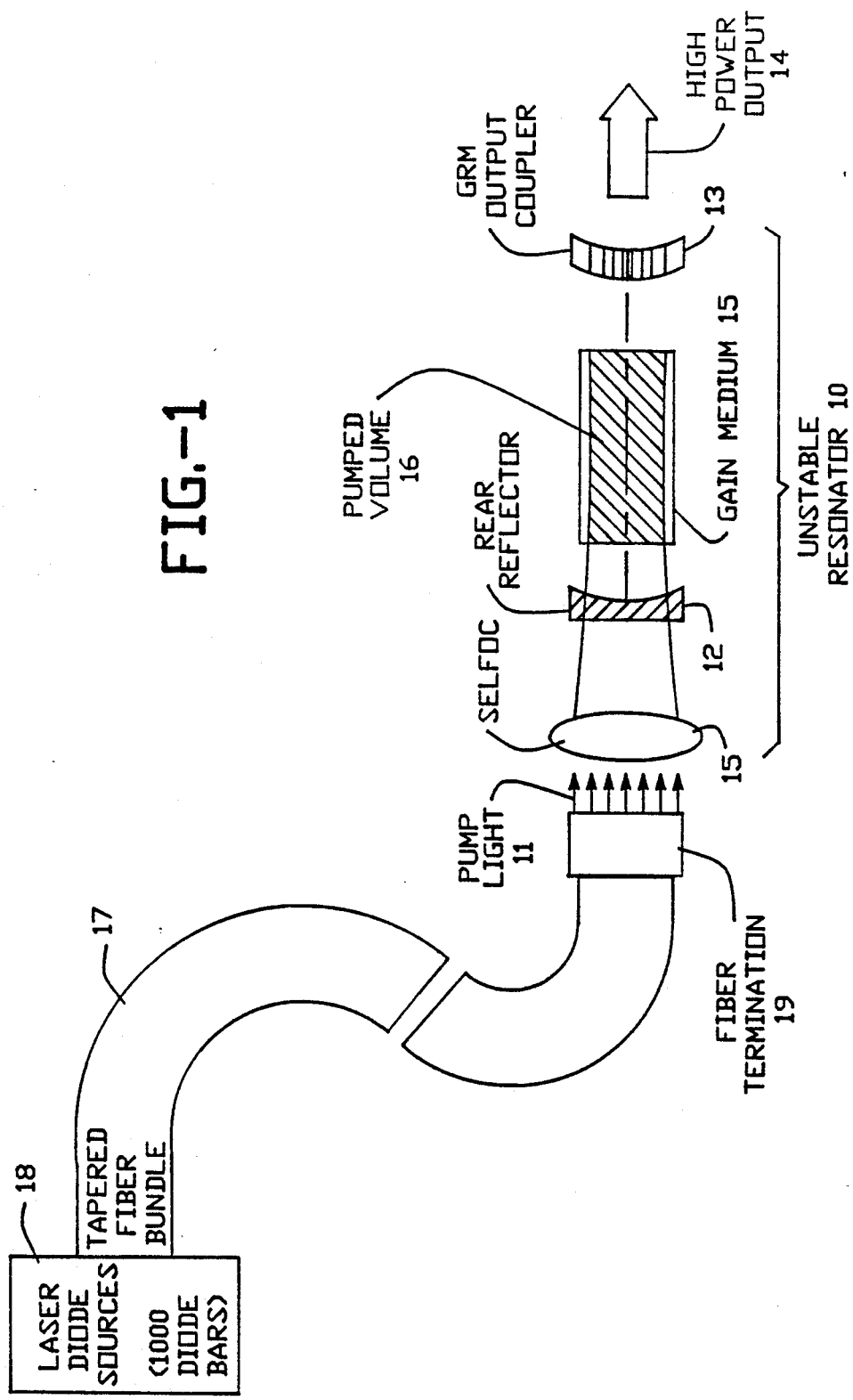
FIG. 1 is a schematic diagram of a laser system according to the present invention.

FIG. 1 schematically illustrates a laser system consisting of an unstable resonator 10 in which pump light 11 is supplied longitudinally into the optical cavity. The optical cavity is defined by a rear reflector 12, which is transmissive of light at the pump wavelength and reflective of light at the cavity mode wavelength, and an output coupler for the unstable resonator 13, such as a graded reflectivity mirror, which partially reflects radiation at the cavity mode wavelength and transmits a high power output beam 14. A gain medium 15 is mounted within the optical cavity.

The pump light 11 is supplied through focusing optics such as a Selfoc lens 15, into the resonator cavity to define a pumped volume 16 within the gain medium 15. The unstable resonator 10 is utilized to efficiently sweep energy out of the pumped volume of the gain medium for high power applications.

In a preferred system, the wavelength of the pump light is approximately 0.81 microns. The cavity mode is supported by a trivalent neodymium dope solid state host, such as $Nd^{3+}$: YAG($Nd^{3+}$: $Y_3Al_5O_{12}$), $Nd^{3+}$: YALO($Nd^{3+}$: $YALO_3$), $Nd^{3+}$: YLF($Nd_{3+}$: $LiYF_4$), $Nd^{3+}$: pentaphosphate($Nd^{3+}$: $P_5O_{12}$), or $Nd^{3+}$: glass, where the glass can be either a silicate or phosphate glass.

The gain medium of FIG. 1 could be comprised of a 5 mm diameter rod of $Nd^{3+}$: YAG. The fiber termination could consist of 1,000 light transmitting fibers each having a circular cross-section of 50 microns for a total bundle cross-section of 5 mm to match the rod.

The resonant cavity can be tuned as a three level or a two level system, such as discussed in my prior U.S. patent application Ser. No. 07/418,287, Filed Oct. 6, 1989.

High energy density pump light 11 is supplied through a tapered fiber bundle 17 from a remote set of laser diode sources 18. The laser diode sources 18 may, for instance, consist of 1,000 diode bars, each generating 0.1 watt of power or more and cooled on a mounting plate as shown schematically in FIG. 2. With a coupling efficiency supplied by tapered light transmitting fibers in the tapered fiber bundle 17 greater than 70%, the tapered fiber bundle 17 supplies 70 watts or more of pump energy to the fiber termination mount 19, at about 357 watts per square centimeter energy density. Such systems can be easily adopted to provide energy densities over a range of 0.01 $MW/cm^2$ to over 10 $MW/cm^2$ energy density output. Tapered fibers are described in detail in U.S. Pat. No. 4,688,884, invented by Scifres et al., entitled FIBER OPTIC COUPLING SYSTEM FOR PHASED-ARRAY Semiconductor LASERS, issued Aug. 25, 1987.

The tapered fiber bundle 17 can be terminated, at a terminating mount 19 using any of a variety of techniques optimized to a particular application. Many of these techniques for terminating fiber bundles are described in U.S. Pat. No. 4,763,975, entitled OPTICAL SYSTEM WITH BRIGHT LIGHT OUTPUT, invented by Scifres et al.

The remote diode sources 18 are capable of generating very large output powers, and when coupled with a tapered fiber bundle 17, supplying those high output powers with a high energy density. The laser diode array further can be cooled using sophisticated cooling techniques required for high power systems, such as thermoelectric cooling, without encumbering the design of the unstable resonator 10.

The Selfoc lens shown in FIG. 1 is used to assist collimation of the pump light for less divergent propagation from the output end of the fiber into the pump volume 16. This lens 15 may or may not be required for a particular application.

Figure 2:
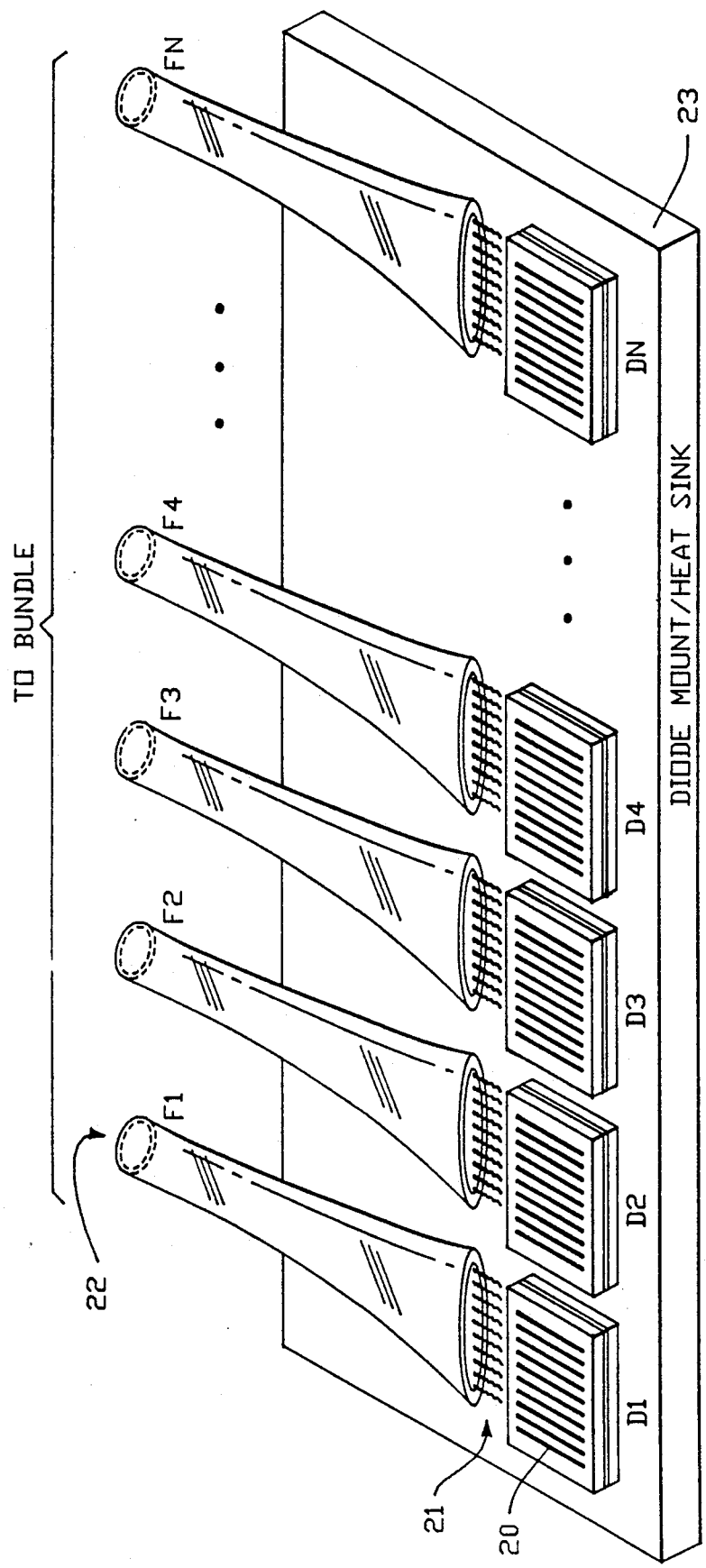
FIG. 2 is a schematic diagram showing a plurality of semiconductor diode laser sources coupled to tapered light transmitting fibers to form the pump energy source according to the present invention.

FIG. 2 provides a schematic illustration of an assembly of laser diode sources consisting of diode bars D1, D2, D3, D4, ... DN, wherein N is any virtually unlimited number. Each of the diode bars D1 through DN is coupled to supply a beam having an extended cross section to a corresponding light transmitting fiber F1, F2, F3, F4, ... FN. These fibers are then stacked to form the tapered fiber bundle 17 of FIG. 1.

The diode bars D1 through DN illustrated in FIG. 2 are shown as ten element bars, with a given element being exemplified by current confining stripe 20 on diode bar D1. A ten element diode bar emits a beam 21 having a cross-section approximately 100 microns wide by approximately 1 micron high. A small divergence of between 5 and 7 degrees of the output beam is also produced. The tapered fibers are designed to match the cross-section of the output beam 21 of the corresponding diode bar to provide for coupling the output 21 into the fiber with high energy density. Thus, the tapered fiber will have a major core diameter which is greater than 100 microns, and a minor core diameter which is much less than 100 microns (e.g. 10 microns) for the embodiment discussed in FIG. 2.

The tapered fiber F1 then conforms to a circular cross-section at the output end with a diameter of about 50 microns. The circular cross-section allows for easy bundling at the fibers so that they may be terminated to provide a high energy density output for pumping the unstable resonator. Of course other output shapes such as rectangular, square, hexagonal or other "stackable" shapes could be used for the output end 22.

The plurality of diode bars D1–DN are mounted on one or more diode mount/heat sinks 23 by which waste heat generated by the diode bars can be efficiently removed without impact on the resonator. Depending on the size and number of the laser diode bars, the amount of energy being generated, and the amount of energy being wasted, a wide variety of cooling systems could be used to suit the needs of the particular application. Cooling systems could be liquid cooled, or air cooled, and active or passive. All of these cooling systems are schematically referred to in FIG. 2 as the heat sink.

Alternative laser systems according to the present invention are illustrated in FIGS. 3 and 4. FIG. 3 illustrates a system which the tapered fiber bundle termination 30 supplies pump light 31 through a Selfoc lens 32 which creates a pumped volume 33 within a solid state gain medium 34. The rear reflector 35 is a dielectric coating on the gain medium 34 itself. The output coupler 36 which defines an unstable resonator 37 is formed using a "dot" output coupler.

Of course the output coupler could be implemented by coating directly onto the gain medium 34.

The system of FIG. 4 is coupled to remote diode sources through tapered fiber bundle 40. The fiber termination 41 supplies pump light 42 through a Selfoc lens 43 to define a pumped volume 44 within a gain medium 45. An unstable resonator is defined by rear reflector 46 and output coupler 47. A frequency doubling element 48 is mounted within the resonant cavity 49 for frequency doubling the output 50. The frequency doubling element 48 could comprise $LiNbO_3$, $\beta BaB_2O_4$, $KNbO_3$, $LiIO_3$, or $KTiOPO_4$.

For the gain media shown in FIGS. 1, 3, and 4, one can employ a cooler, such as a thermoelectric cooler, to dissipate what heat is generated after laser diode optical excitation to improve overall system performance and efficiency. Also, for the frequency doubling nonlinear optic in FIG. 4, one would employ an oven to maintain the crystal temperature at an optimum phase matching temperature for the fundamental wavelength emanating from the $Nd^{3+}$ gain medium.

According to the present invention, high energy density pump light generated by laser diodes, or other sources of extended cross-section beams, can be used for providing high power laser output with solid state mediums, such as $Nd^{3+}$: YAG.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A laser system comprising:
   first optic means for transmitting radiation at a pump wavelength and for reflecting radiation at a cavity wavelength;
   second optic means, mounted in relation to the first optic means to form an unstable optical cavity, for partially reflecting radiation at the cavity wavelength to establish a cavity mode and for partially transmitting radiation in the cavity mode to supply laser output;
   a solid state gain medium, mounted within the unstable optical cavity, for providing laser gain for the cavity mode;
   a plurality of laser sources, each laser source in the plurality generating a beam of radiation at the pump wavelength having an extended cross-section with characteristic lateral and transverse widths;
   a plurality of light transmitting fibers, each light transmitting fiber having an input end and an output end, and being coupled with a corresponding laser source,
   the input end of each fiber having a cross-section substantially matching the transverse and lateral widths of the beams generated by the corresponding laser source, and being coupled to receive the beam of radiation generated by the corresponding laser source,
   the output ends of the plurality of light transmitting fibers being bundled to deliver the beams coupled into the fibers as a composite light source; and
   means, mounted adjacent to the first optic means and connected to the plurality of light transmitting fibers near the output ends, for guiding the composite light source through the first optic means into the gain medium to deliver pump energy.

2. The laser system of claim 1, wherein each laser source in the plurality generates a beam having a lateral width of more that 50 microns and a transverse width of less than 50 microns, and the input end of each of the light transmitting fibers in the plurality has an oblong cross-section defining characteristic major and minor core diameters, the major core diameter being at least as large as the lateral width of the beam and the minor core diameter being less than the lateral width.

3. The laser system of claim 2, wherein the output ends of each of the light transmitting fibers in the plurality has a cross-section with a maximum width less than the major core diameter.

4. The laser system of claim 3, wherein the cross-section of the output ends of each of the light transmitting fibers in the plurality is circular.

5. The laser system of claim 1, wherein the means for guiding comprises a terminating mount near the output ends of the plurality of light transmitting fibers.

6. The laser system of claim 1, wherein the means for guiding comprises a terminating mount near the output ends of the plurality of light transmitting fibers; and a Selfoc lens, mounted between the mount and the first optic means.

7. The laser system of claim 1, wherein each of the plurality of light transmitting fibers has a coupling efficiency of at least 70%.

8. The laser system of claim 1, further including a frequency doubling element mounted between the gain medium and the second optic means within the unstable optical cavity.

9. The laser system of claim 1, wherein the composite light source has an energy density is greater than 100 $W/cm^2$.

10. The laser system of claim 1, wherein the composite light source supplies at least 10 watts pump power.

11. A laser system comprising:
    first optic means for transmitting radiation at a pump wavelength and for reflecting radiation at a cavity wavelength;
    second optic means, mounted in relation to the first optic means to form an unstable optical cavity, for partially reflecting radiation at the cavity wavelength to establish a cavity mode and for partially transmitting radiation in the cavity mode to supply laser output;
    a trivalent neodymium doped solid state gain medium, mounted within the unstable optical cavity, for providing laser gain for the cavity mode;
    a plurality of semiconductor laser sources, each semiconductor laser source in the plurality generating a beam of radiation at the pump wavelength having a characteristic lateral and transverse widths;
    a plurality of light transmitting fibers, each light transmitting fiber having an input end and an output end, and being coupled with a corresponding semiconductor laser source,
    the input end of each fiber having a cross-section substantially matching the transverse and lateral widths of the beams generated by the corresponding semiconductor laser source, and being coupled to receive the beam of radiation generated by the corresponding semiconductor laser source, the output ends of the plurality of light transmitting fibers being bundled to deliver the beams coupled into the fibers as a composite light source; and a terminating mount adjacent to the first optic means and connected to the plurality of light transmitting fibers near the output ends, and a lens mounted between the first optic means and the terminating mount for guiding the composite light source through the first optic means into the gain medium to deliver pump energy.

12. The laser system of claim 11, wherein each semiconductor laser source in the plurality generates a beam having a lateral width of more that 50 microns and a transverse width of less than 10 microns, and the input end of each of the light transmitting fibers in the plurality has an oblong cross-section defining characteristic major and minor core diameters, the major core diameter being at least as large as the lateral width of the beam and the minor core diameter being less than the lateral width.

13. The laser system of claim 12, wherein the output ends of each of the light transmitting fibers in the plurality has a cross-section with a maximum width less than the major core diameter.

14. The laser system of claim 13, wherein the cross-section of the output ends of each of the light transmitting fibers in the plurality is circular.

15. The laser system of claim 11, further including a frequency doubling element mounted between the gain medium and the second optic means within the unstable optical cavity.

16. The laser system of claim 11, wherein the composite light source has an energy density greater than 100 W/cm$^2$.

17. The laser system of claim 11, wherein the composite light source supplies at least 10 watts pump power.

18. The laser system of claim 11, wherein each of the plurality of light transmitting fibers has a coupling efficiency of at least 70%.

* * * * *